(12) United States Patent
Lee et al.

(10) Patent No.: US 7,305,332 B1
(45) Date of Patent: Dec. 4, 2007

(54) SYSTEM AND METHOD FOR AUTOMATIC EXTRACTION OF TESTING INFORMATION FROM A FUNCTIONAL SPECIFICATION

(75) Inventors: Douglas Lee, Cupertino, CA (US); Fanyun (Michelle) Kong, San Jose, CA (US); Marc Spitzer, San Jose, CA (US); John Packer, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 540 days.

(21) Appl. No.: 10/758,070

(22) Filed: Jan. 14, 2004

(51) Int. Cl.
*G06F 17/50* (2006.01)

(52) U.S. Cl. .......................... 703/13; 703/14; 703/15; 716/2; 716/8

(58) Field of Classification Search ............ 703/13–21; 716/1–18; 714/29, 45; 702/120
See application file for complete search history.

(56) References Cited

U.S. PATENT DOCUMENTS

| | | | | |
|---|---|---|---|---|
| 5,974,241 A * | 10/1999 | Fusco | ............................. | 716/2 |
| 6,077,304 A * | 6/2000 | Kasuya | ........................ | 703/14 |
| 6,083,269 A * | 7/2000 | Graef et al. | ................... | 703/14 |
| 6,498,999 B1 * | 12/2002 | Reise | ........................ | 702/120 |
| 6,523,151 B2 | 2/2003 | Hekmatpour | | |
| 6,760,888 B2 * | 7/2004 | Killian et al. | .................. | 716/1 |
| 6,862,717 B2 * | 3/2005 | Nadeau-Dostie et al. | ...... | 716/4 |
| 7,031,900 B1 * | 4/2006 | Vakada et al. | ................. | 703/17 |
| 7,047,174 B2 * | 5/2006 | Koh et al. | ..................... | 703/14 |
| 7,076,415 B1 * | 7/2006 | Demler et al. | ................ | 703/14 |
| 7,103,860 B2 * | 9/2006 | Price et al. | ..................... | 716/4 |
| 7,137,087 B1 * | 11/2006 | Mohanty et al. | ............... | 716/5 |
| 2002/0188432 A1 * | 12/2002 | Houlihane et al. | ............ | 703/20 |
| 2003/0115564 A1 * | 6/2003 | Chang et al. | ................... | 716/8 |
| 2003/0125920 A1 * | 7/2003 | Matsuoka et al. | ............ | 703/15 |
| 2003/0171908 A1 * | 9/2003 | Schilp et al. | ................. | 703/16 |
| 2003/0225565 A1 * | 12/2003 | Garcia et al. | ................. | 703/23 |
| 2004/0111252 A1 * | 6/2004 | Burgun et al. | ................ | 703/28 |

OTHER PUBLICATIONS

"Automating Functional Coverage Analysis Based on and Executable Specification", Regimbal et al, Proceedings 3rd International Workshop on SoC, 2003 IEEE.*

* cited by examiner

*Primary Examiner*—Fred Ferris
(74) *Attorney, Agent, or Firm*—Martine Penilla & Gencarella LLP

(57) ABSTRACT

A system and method for testing a development device includes extracting multiple parameters of the development device from a product specification for the development device. The parameters being arranged in a predetermined first order. The parameters are stored in a testing data file. The testing data file can be input into a test bench system being coupled to the development device. The test bench system can test the development device.

13 Claims, 6 Drawing Sheets

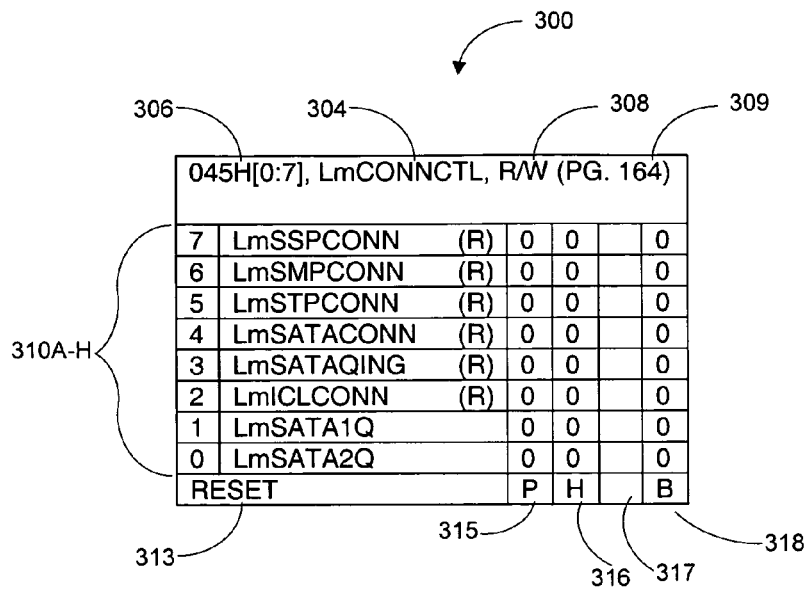
FIGURE 3A
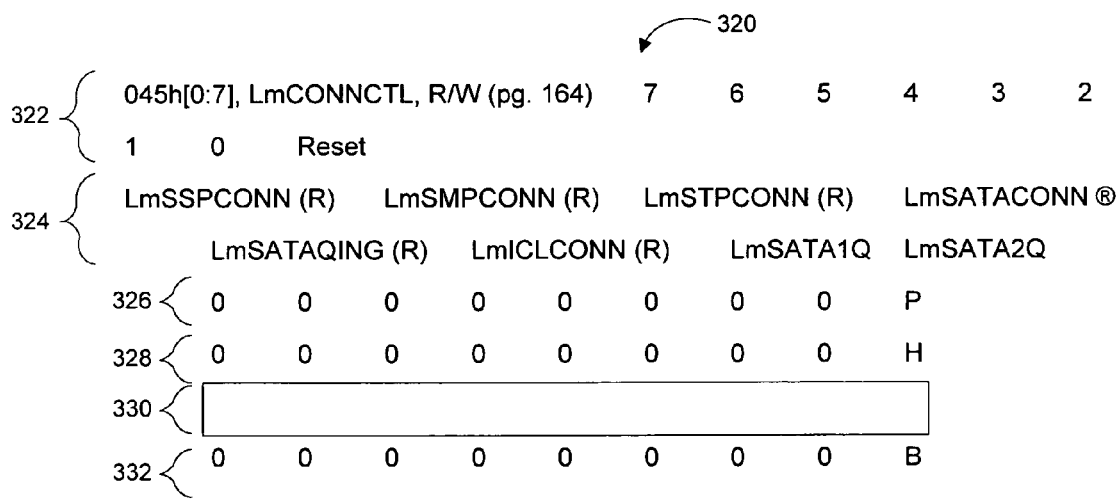
FIGURE 3B
← 330
45 LmCONNCTL 1 0000_0000 03 00 1 0 1 2 3 4 5 6 7
FIGURE 3C

| 31 | LmMnXMTCNT[31] | 0 | 0 | 0 | 23 | LmMnXMTCNT[23] | 0 | 0 | 04ch[1], LmMnXMTCNT, R/W (pg. 169) | 0 | 0 | 15 | LmMnXMTCNT[15] | 0 | 0 | 0 | 7 | LmMnXMTCNT[7] | 0 | 0 |
|---|---|---|---|---|---|---|---|---|---|---|---|---|---|---|---|---|---|---|---|---|
| 30 | LmMnXMTCNT[30] | 0 | 0 | 0 | 22 | LmMnXMTCNT[22] | 0 | 0 | | 0 | 0 | 14 | LmMnXMTCNT[14] | 0 | 0 | 0 | 6 | LmMnXMTCNT[6] | 0 | 0 |
| 29 | LmMnXMTCNT[29] | 0 | 0 | 0 | 21 | LmMnXMTCNT[21] | 0 | 0 | | 0 | 0 | 13 | LmMnXMTCNT[13] | 0 | 0 | 0 | 5 | LmMnXMTCNT[5] | 0 | 0 |
| 28 | LmMnXMTCNT[28] | 0 | 0 | 0 | 20 | LmMnXMTCNT[20] | 0 | 0 | | 0 | 0 | 12 | LmMnXMTCNT[12] | 0 | 0 | 0 | 4 | LmMnXMTCNT[4] | 0 | 0 |
| 27 | LmMnXMTCNT[27] | 0 | 0 | 0 | 19 | LmMnXMTCNT[19] | 0 | 0 | | 0 | 0 | 11 | LmMnXMTCNT[11] | 0 | 0 | 0 | 3 | LmMnXMTCNT[3] | 0 | 0 |
| 26 | LmMnXMTCNT[26] | 0 | 0 | 0 | 18 | LmMnXMTCNT[18] | 0 | 0 | | 0 | 0 | 10 | LmMnXMTCNT[10] | 0 | 0 | 0 | 2 | LmMnXMTCNT[2] | 0 | 0 |
| 25 | LmMnXMTCNT[25] | 0 | 0 | 0 | 17 | LmMnXMTCNT[17] | 0 | 0 | | 0 | 0 | 9 | LmMnXMTCNT[9] | 0 | 0 | 0 | 1 | LmMnXMTCNT[1] | 0 | 0 |
| 24 | LmMnXMTCNT[24] | 0 | 0 | 0 | 16 | LmMnXMTCNT[16] | 0 | 0 | | 0 | 0 | 8 | LmMnXMTCNT[8] | 0 | 0 | 0 | 0 | LmMnXMTCNT[0] | 0 | 0 |
| RESET | | B | H | P | RESET | | B | H | | P | B | RESET | | H | P | B | RESET | | H | P |

FIGURE 3D

4C LmMnXMTCNT 4 0000_0000_0000_0000_0000_0000_0000_0000 FFFF_FFFF_0000_0000 0 1

FIGURE 3E

SYSTEM AND METHOD FOR AUTOMATIC EXTRACTION OF TESTING INFORMATION FROM A FUNCTIONAL SPECIFICATION

BACKGROUND OF THE INVENTION

1. Field of the Invention

The present invention relates generally to device test and simulation, and more particularly, to systems and methods for preparing for a device test and simulation.

2. Description of the Related Art

Development of a new device such as an integrated circuit, or other electronic device, requires extensive testing to determine if a proposed design meets the design performance requirements. One approach to developing a new device includes simulating the device such as by designing a computer program that simulates the operation of the device being developed (i.e., development device). Such a computer program is typically referred to as a device simulation. Device simulations are typically run in a test bench environment. As the new device development progresses through the various developmental phases (i.e., a developmental cycle) an actual hardware prototype device is typically built and tested. The test bench environment can also be used to test the prototype device.

Development devices are typically defined in a design document referred to as a product specification. By way of example, a product specification for an ASIC development device would define the required operations, I/O requirements and performance (e.g., speed, power and thermal efficiency). The ASIC device product specification can also include physical aspects of the development device (e.g., device size, circuit design, materials, manufacturing processes, etc.). As the development device is refined during the development cycle, the product specification is correspondingly refined.

As discussed above, new devices under development are tested throughout the development cycle. By way of example, a test of the simulated development device can identify performance problems that in turn require design changes and corresponding product specification revisions. Later, during the prototyping phase, tests of the prototype development device can result in design changes and corresponding revisions to the product specification.

Typical test bench set up requires a very laborious, manual, detailed review of the product specification to define and set up all of the test parameters of the then current revision of the development device. By way of example, registers are widely used in ASICs. Each register is defined by a location, a size (i.e., number of bits) and a type (e.g., read only, write or read/write). Other aspects of each register can also be defined. It is very common that registers used in the development device will change though the development cycle. By way of example, a register may change in size or location.

FIG. 1A is a flowchart of the method operations 100 of a typical register set-up for a development device test. In operation 105, a product specification is received. In operation 110, the product specification is manually reviewed to determine the various parameters of each register. In operation 115, each register is manually set up (i.e., the various parameters of each register are manually entered into the test bench or simulation). In operation 120, the registers in the development device are tested. Often an additional operation is also added that includes running a verification check on the testing data entered in the test bench. This verification check typically examines the testing data to make sure all the data required to perform a test is entered (e.g., all the data fields have "something" in them). However, the verification operation does not and cannot compare the testing data that was actually entered in the test bench to the data in the product specification.

One of the problems with the above manual data entry method, operations 100, is that there are many opportunities for missing data or erroneous data entry that can then cause the development device to fail the test. Alternatively, the missing data or erroneous data entry can cause one or more aspects of the development device to not be tested at all. In either case, the manual data entry approach is very likely to introduce failures rather than detect actual problems. In addition, the manual data entry approach can be extremely labor intensive and time consuming, thereby unnecessarily extending the development cycle.

FIG. 1B is a flowchart of the method operations 150 of a typical register set-up for a development device test for a revised product specification. In operation 155, the revised product specification is received. In operation 160, the revised product specification is manually reviewed to determine the changes to any of the various parameters of each register. In operation 165, each register set up is then manually updated (i.e., the various revised parameters of each register are manually entered into the test bench). In operation 170, the registers in the development device are tested.

As described above, additional errors can be introduced with each revision to the product specification. In view of the foregoing, there is a need for a simpler and more precise method of extracting the development device parameters from the product specification and applying extracted parameters to the test environment.

SUMMARY OF THE INVENTION

Broadly speaking, the present invention fills these needs by providing an improved and more efficient system and method of extracting testing data from a product specification will now be described. It should be appreciated that the present invention can be implemented in numerous ways, including as a process, an apparatus, a system, computer readable media, or a device. Several inventive embodiments of the present invention are described below.

One embodiment provides a method for testing a development device that includes extracting multiple parameters of the development device from a product specification for the development device. The parameters being arranged in a predetermined first order. The parameters are stored in a testing data file. The testing data file can be input into a test bench system being coupled to the development device. The test bench system can test the development device.

The product specification can also be received. Receiving the product specification can include converting the product specification from a first format to a second format. The second format can be a text format.

The parameters can include any parameters necessary to test a selected operation of the development device. The parameters of the development device can, for example, be for at least one register in the development device. The parameters for the at least one register can include one or more of a register location, a register type, and a register size, among other aspects of the register.

The predetermined first order can include a table having a header and a footer. The header can include at least one of a name and a location.

Storing the parameters in a testing data file can include rearranging the parameters into a second order. The development device can be a physical device or can be simulated in the test bench system.

Another embodiment provides a system for extracting testing data for a development device. The system includes a processor coupled to a computer readable medium having computer readable instructions stored thereon. The instructions can include logic for extracting multiple parameters of the development device from a product specification for the development device. The parameters being arranged in a predetermined first order. Logic for storing the parameters in a testing data file can also be included. Logic for inputting the testing data file into a test bench system can also be included.

A computer network can also be coupled to the processor and the logic for inputting the testing data file into the test bench system can include logic for transmitting the testing data file to the test bench system via the computer network. The test bench system can include logic for testing the development device. The test bench system can also be part of the system for extracting testing data for the development device. The test bench system can include logic for testing the development device.

The computer readable instructions can also include logic for receiving the product specification. The logic for receiving the product specification can include logic for converting the product specification from a first format to a second format.

The parameters can include any parameters necessary to test a selected operation of the development device. The parameters of the development device can be for at least one register in the development device. The development device can be simulated (i.e., a device simulation) or a physical development device.

Yet another embodiment provides a test bench system. The test bench system includes a processor and a storage facility coupled to the processor. The storage facility contains instructions executable by the processor. The instructions can include logic for receiving a product specification, the product specification having multiple parameters of the development device, the parameters being arranged in a predetermined first order. The instructions can also include logic for extracting the parameters from the product specification and logic for storing the parameters in a testing data file. Logic for inputting the testing data file into a test bench system and logic for testing the development device can also be included.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 3A is an exemplary table of register data, in accordance with one embodiment of the present invention.

FIG. 3B is a first exemplary reformatted version of the table, in accordance with one embodiment of the present invention.

FIG. 3C is a second reformatted version, in accordance with one embodiment of the present invention.

FIG. 3D shows a standard format for a 32-bit register, in accordance with one embodiment of the present invention.

FIG. 3E is a second reformatted version of the standard format for the 32-bit register, in accordance with one embodiment of the present invention.

DETAILED DESCRIPTION OF THE EXEMPLARY EMBODIMENTS

Figure 1B:
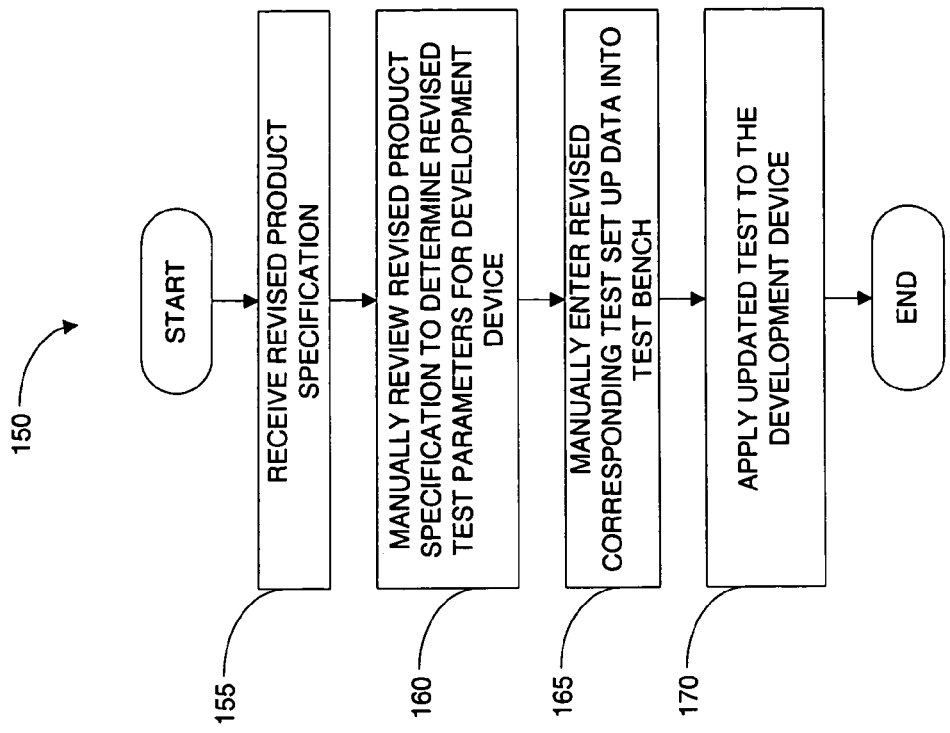
FIG. 1B is a flowchart of the method operations of a typical register set-up for a development device test for a revised product specification.
Figure 1A:
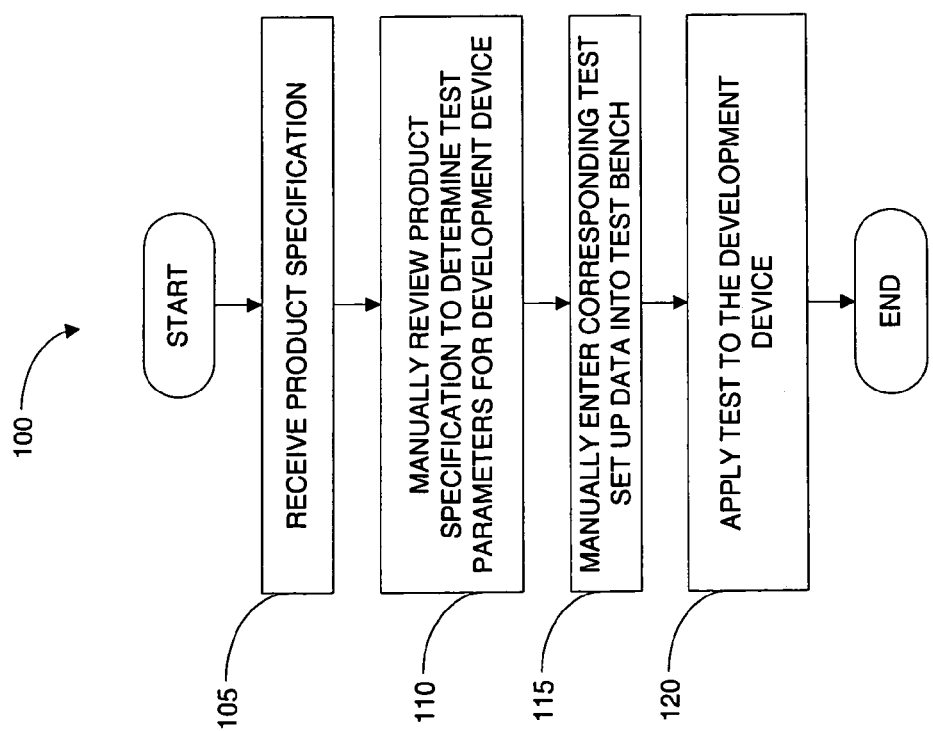
FIG. 1A is a flowchart of the method operations of a typical register set-up for a development device test.

Several exemplary embodiments for an improved and more efficient system and method of extracting development device testing data from a product specification will now be described. It will be apparent to those skilled in the art that the present invention may be practiced without some or all of the specific details set forth herein.

Product specifications are living, individual product definitions produced by their respective, human, and often individual, designers. The product specifications are said to be living documents as they evolve as the product they define is refined and modified during the development cycle. Typically, there is no standard convention or format to a product specification or for defining the various aspects for each of the individual portions of the development device defined by the product specification. By way of example, there is typically no standard convention for describing the various parameters of each register described within a product specification. However, each product specification typically adopts a standard format so as to present the data in an organized and consistent manner throughout. Adopting a standard format throughout the product specification aids in understanding and presenting the data such as the various parameters of each register described within a product specification.

In one embodiment, a standard format is defined for at least a portion of the product specification. The standard format provides an organization scheme for presenting each of the various parameters of the corresponding portion of the development device. By way of example, the standard format can be used to present the various parameters of each register within the development device. Because the standard format for each of the various parameters of each register is known, then the various parameters of each register can be easily identified by a search through the product specification. Further, because the standard format is known, an electronic form of the product specification can be scanned for the data such as by a computer.

Alternatively, the standard format can define the organization scheme of the entire product specification. In this embodiment, the standard format provides the capability for the product specification document to be automatically searched by a search/sort application. By way of example, the search/sort application can identify the various parameters of each register from the product specification. The search/sort application can be written in any suitable programming language (e.g., Perl, Awk, C+ or other suitable programming language).

An extraction/export capability that is included within or used in conjunction with the search/sort application can provide the capability to automatically extract the identified parameters of each register to the test bench environment. In this manner, the various parameters of each register can be quickly, easily and accurately extracted from the latest revision of the product specification and input to the test bench environment. The extraction/export application can also be written in any suitable programming language (e.g., Perl, C+ or other suitable programming language).

Figure 2A:
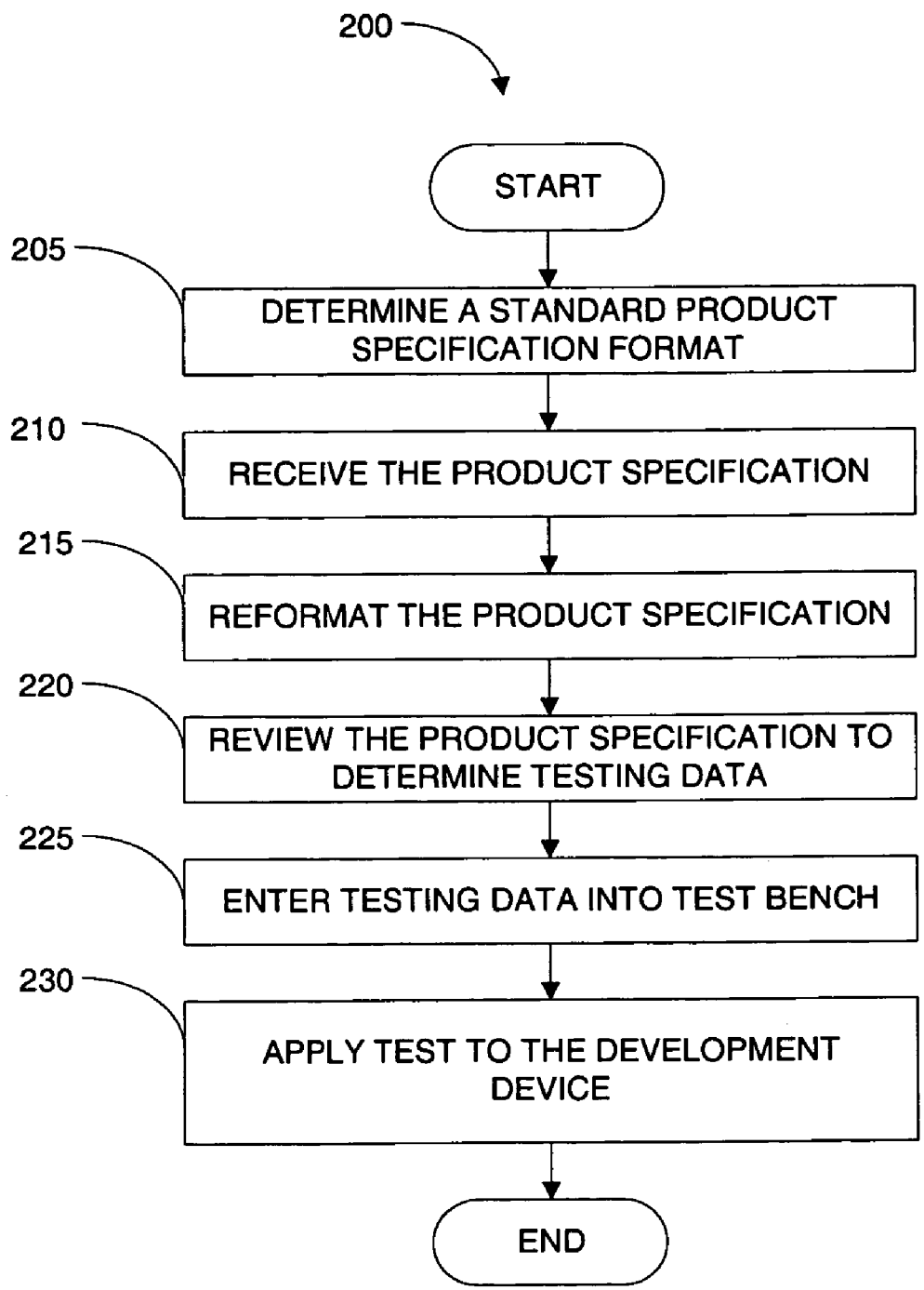
FIG. 2A is a flowchart of the method operations for automatically extracting the testing data from the product specification, in accordance with one embodiment of the present invention.

FIG. 2A is a flowchart of the method operations 200 for automatically extracting the testing data from the product specification, in accordance with one embodiment of the present invention. In an operation 205, a standard format is determined. The standard format can be defined in an electronic format and stored in a computer.

In an operation 210, a product specification is received. The product specification can be received in an electronic form in the computer so that a search/sort application can be used by the computer to search and sort the product specification. In an optional operation 215, the product specification can also be converted from a first format to a format capable of being accessed by the search and sort application. By way of example the product specification can be converted from an Adobe Acrobat format (i.e., .pdf) or a MicroSoft Word format (i.e., .doc) to a second format such as a text format. The optional conversion operation 215 can also include converting the specific testing data format in the product specification to a standard testing data format.

In operation 220, the product specification is reviewed to determine the various testing data (e.g., the various register data for each register). In an operation 225, the testing data is automatically entered into a testing bench that will test the development device. The testing data can also be reformatted for input to and/or use by the testing bench. In an operation 230, the development device is tested and the method operations end.

A revised product specification can also use the method operations 200 to determine and extract any revised testing data contained therein. The revised testing data can be used to overwrite the existing testing data in the test bench.

In an alternative embodiment, a revised product specification can be compared to the previous revision of the product specification and a revision report of the differences can be produced. Then, rather than overwriting all of the testing data only the revised testing data must be updated.

Figure 2B:
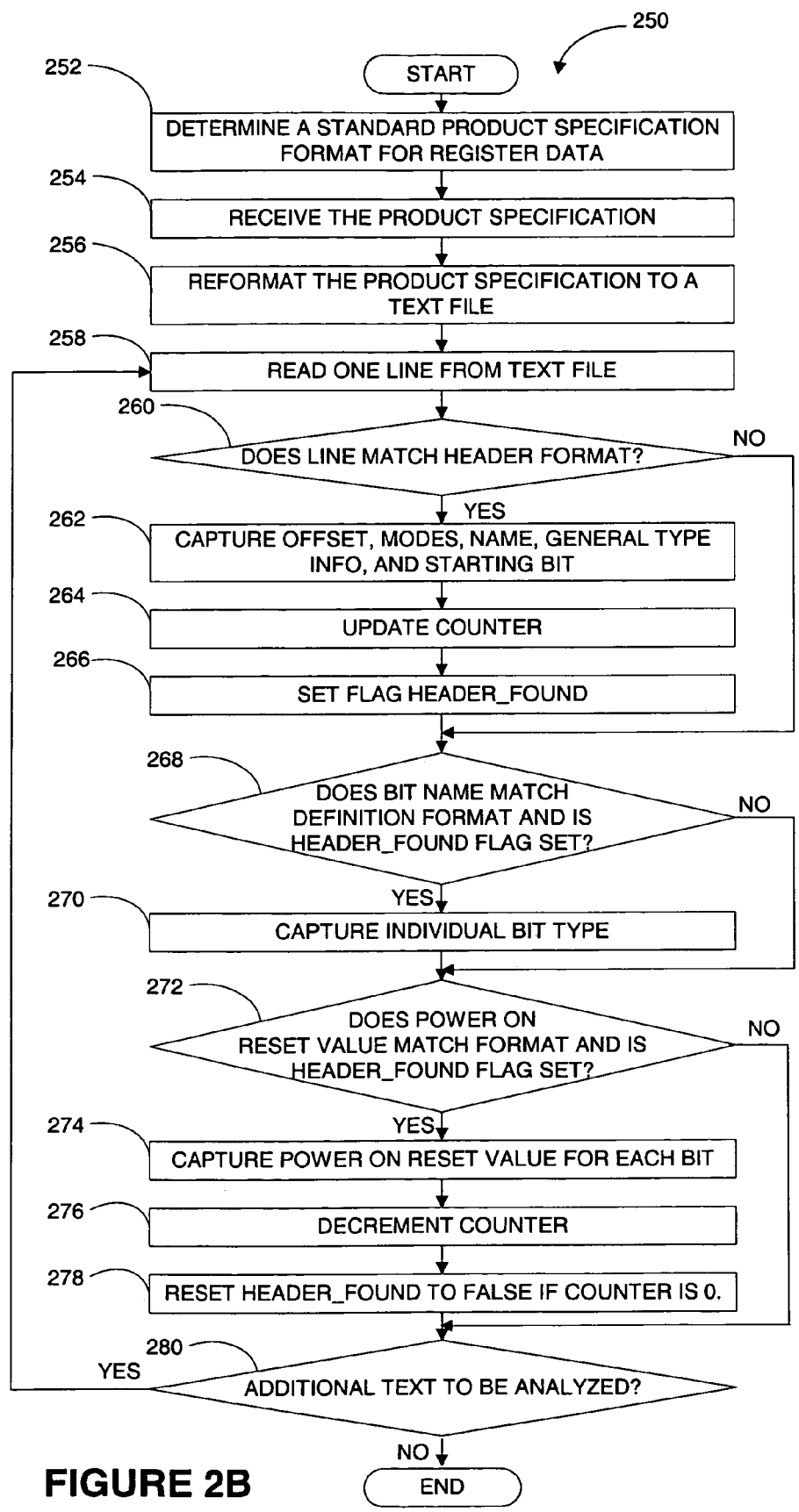
FIG. 2B is an exemplary embodiment of the method operations for extracting register data from a product specification, in accordance with one embodiment of the present invention.

FIG. 2B is an exemplary embodiment of the method operations 250 for extracting register data from a product specification, in accordance with one embodiment of the present invention. In an operation 252, a standard format is determined similar to operation 205, as described above.

In an operation 254, a product specification is received. The product specification can be received in an electronic form in the computer so that a search/sort application can be used by the computer to search and sort the product specification. In an optional operation 256, the product specification can also be converted from a first format to a format capable of being accessed by the search and sort application. In one embodiment, the product specification is reformatted to a text file.

FIG. 3A is an exemplary table 300 of register data, in accordance with one embodiment of the present invention. The table 300 includes a header 302. The header 302 includes a register name 304, a register offset 306 (e.g., location, expressed in hexadecimal), register type 308 (e.g. R/W (read write), R (read only), R/C (read/clear, etc.), and a page number reference 309 where the register is discussed in the product specification can also be included. The table 300 also includes descriptive data for each of the eight bits 310A-H in the register. By way of example bit 7 310A has a bitname of LmSSPCONN. The LmSSPCONN bit 310A has a bit type 312A of (R) indicating that even though the register a read/write, the LmSSPCONN bit 310A cannot be written into but rather can only be read from. A RESET 313 is in a final line of the table 300. The RESET 313 indicates that the register has a reset in power-on (P), hard reset (H) and block reset (B). The corresponding columns 315, 316, 317, 318 indicate the reset values for the respective bits under each of the three (e.g., P, H and B) reset modes. While only three reset modes are shown, accommodations are made for a fourth reset mode and the additional reset modes could also be shown.

FIG. 3B is a first exemplary reformatted version 320 of the table 300, in accordance with one embodiment of the present invention. The reformatted version 320 converts the table 300 into a text file. The reformatted version 320 converts each column of the table 300 into a corresponding line of text 322-332. In this instance the line of text is "tab delimited" (i.e., a tab is inserted between each datum) but other methods of conversion and delimitation could also be used. A first column of the table 300 includes the table header 302 and the bit numbers 311A and the reset 313. A first line 322 of the first reformatted version 320 includes the register offset 306, the register name 304, the register type 308, the page number reference 310, the bits 7 to 0 and the RESET, respectively, are also included in the first line 322. A second line 324 includes the bitnames 311A-H and respective bit types 312A-F, where applicable, that are included in the second column 312. A third line 326 includes the data from the third column 314. A fourth line 328 includes the data from the fourth column 316. A fifth line 330 is blank as the data in the corresponding fifth column 318 is also blank. A sixth line 332 includes the data from the sixth column 320.

FIG. 3C is a second reformatted version, in accordance with one embodiment of the present invention. The entire register data table 300 is reformatted to a single line of text 330 that includes in the following order: offset in hex, name, length in byte, power on reset value in binary, register type in hex: read/write bits: 1, all other:0, read/clear type in hex: read/clear bits: 1, all other:0, mode type: Unique:0, Common: 1, and valid modes separated by one space.

Returning now to FIG. 2B, in operation 258, a line of text is read from the product specification. In an operation 260, the line of text is analyzed to determine if the line of text matches a header text.

If, in operation 260 the line of text does not match the header text, then the method operations continue at operation 268 below. Alternatively, if the line of text matches the header text, then the method operations continue at operation 262 below.

In operation 262, the line of text is analyzed to extract header data. The header data can provide general information regarding the register such as the offset, modes, register name and type and starting bit, etc. The header data can also provide organizational keys of how the register data is organized in a subsequent line of text. In operation 262, the general register data (e.g., offset, modes, register name and type and starting bit) is captured from the line of text. Capturing the register data can include loading the register data in the test bench.

In an operation 264, a counter is updated. The counter can be used to track the number of the register whose data is being collected from the subsequent lines of text. In an operation 266, a header found flag can be set to identify that a header had been found.

In operation 268, the bit name format is analyzed to determine if it matches the definition format for a bit name. If the bit name format does match the definition format then that indicates that each individual bit has specific, individual bit type. By way of example, a register can include 8 bits and the register type can be a read/write register, indicating that the register can be both written to and read from. However, each of the 8 bits with the register can be designated as being a read only or a write only bit.

If the bit name format does match the definition format and the header_found flag is set (i.e., in operation 266 above) then in an operation 270, the individual bit type data is captured. Capturing the individual bit type data can include loading the individual bit type data in the test bench. If the bit name format does not match the definition format and/or the header_found flag is not set, then the method operations continue in operation 272.

In operation 272, a power on reset value is analyzed to determine if it matches the format to indicate the initial power on settings for the register bits (i.e., initial settings for the bits). If the power on reset value does not match the format and/or the header_found flag is not set (i.e., in operation 266 above), then the method operations continue in operation 280 below. Alternatively, if both the power on reset value matches the format and the header_found flag is set, then the method operations continue in operation 274 below.

In operation 274, the power on reset value for each bit is captured. In an operation 276, the counter is decremented. In operation 278, the header_found flag is reset to false if the counter set to 0. In operation 280, the text is analyzed to determine if additional text is to be analyzed. If additional text is to be analyzed then the method operations continue in operation 258 as described above. If no additional text is to be analyzed then the method operations end.

A revised product specification can also use the method operations 250 to determine and extract any revised register data contained therein. The revised register data can be used to overwrite the existing register data in the test bench.

While the above example registers are only 8-bit registers it should be understood that a standard format for larger (or smaller) register could also be created. FIG. 3D shows a standard format 350 for a 32-bit register, in accordance with one embodiment of the present invention. The standard format 350 includes a header 352, similar to the header 302 described above. A first bit 354 indicates the size of the register. By way of example, since the first bit is "31" and since the last bit is always set to be "0" in the standard format, then the register is a 32-bit register. FIG. 3E is a second reformatted version 370 of the standard format 350 for the 32-bit register, in accordance with one embodiment of the present invention. The entire register data table 350 is reformatted to a single line of text.

Figure 4:
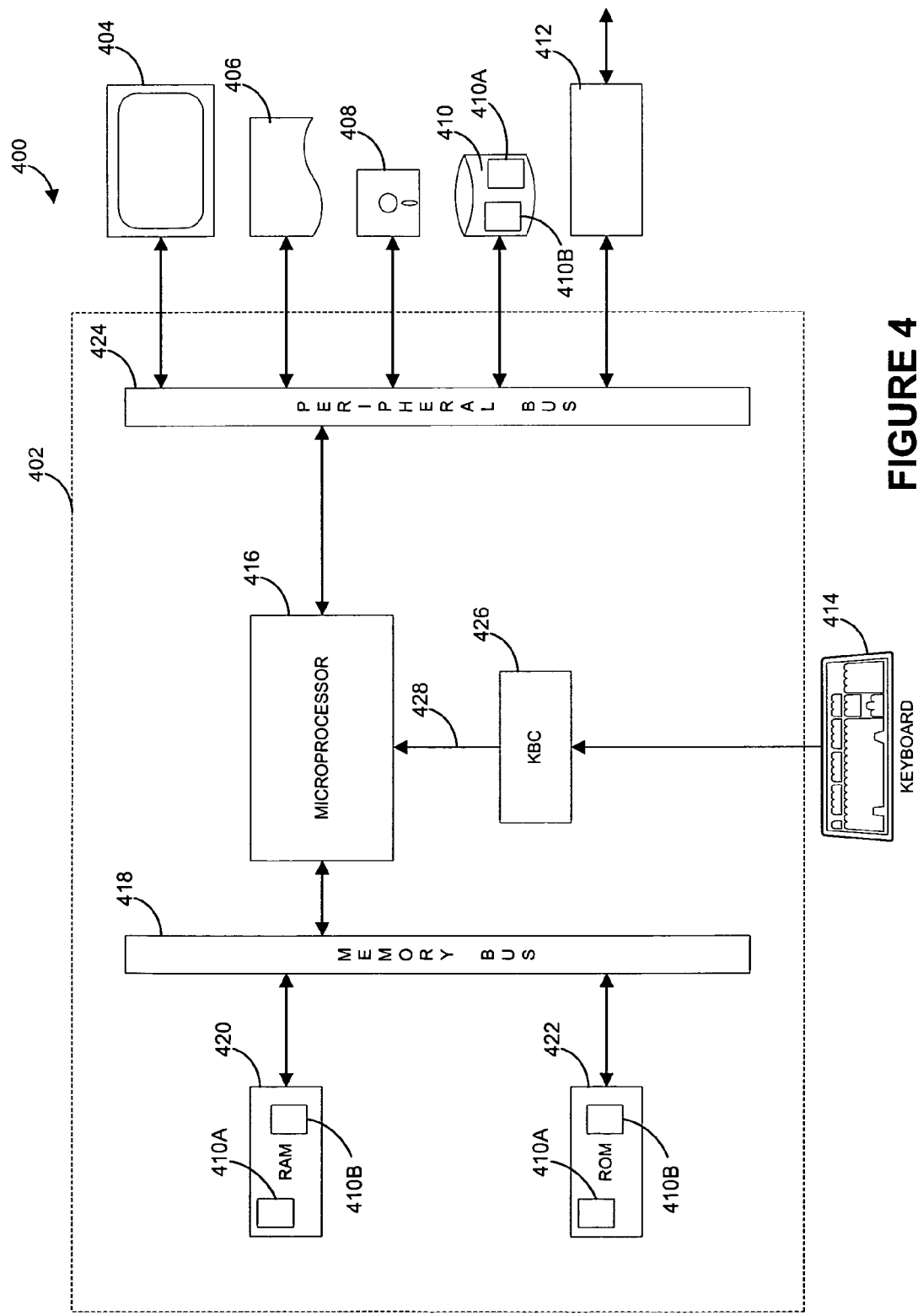
FIG. 4 is a block diagram of an exemplary computer system in accordance with one embodiment of the present invention.

FIG. 4 is a block diagram of an exemplary computer system 400 in accordance with one embodiment of the present invention. The computer system 400 could be used to perform some or all of the operations described above. By way of example, the computer system 400 can be used to reformat the product specification into a standard format. The computer system 400 can also be used for searching and capturing the testing data contained with the product specification. The computer system 400 can also export the captured testing data to a test bench environment or alternatively, the computer system can host the test bench environment.

The computer system 400 includes a digital computer 402, a display screen (or monitor) 404, a printer 406, a floppy disk drive 408, a hard disk drive 410, a network interface 412, and a keyboard 414. The digital computer 402 includes a microprocessor 416, a memory bus 418, random access memory (RAM) 420, read only memory (ROM) 422, a peripheral bus 424, and a keyboard controller (KBC) 426. The digital computer 402 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 416 is a general-purpose digital processor, which controls the operation of the computer system 400. The microprocessor 416 can be a single-chip processor or can be implemented with multiple components. Using instructions retrieved from memory, the microprocessor 416 controls the reception and manipulation of input data and the output and display of data on output devices.

The memory bus 418 is used by the microprocessor 416 to access the RAM 420 and the ROM 422. The RAM 420 is used by the microprocessor 416 as a general storage area and as scratch-pad memory, and can also be used to store input data and processed data. The ROM 422 can be used to store instructions or program code followed by the microprocessor 416 as well as other data.

The peripheral bus 424 is used to access the input, output, and storage devices used by the digital computer 402. In the described embodiment, these devices include the display screen 404, the printer device 406, the floppy disk drive 408, the hard disk drive 410, and the network interface 412. The keyboard controller 426 is used to receive input from keyboard 414 and send decoded symbols for each pressed key to microprocessor 416 over bus 428.

The display screen 404 is an output device that displays images of data provided by the microprocessor 416 via the peripheral bus 424 or provided by other components in the computer system 400. The printer device 406, when operating as a printer provides an image on a sheet of paper or a similar surface. Other output devices such as a plotter, typesetter, etc. can be used in place of, or in addition to, the printer device 406.

The floppy disk drive 408 and the hard disk drive 410 can be used to store various types of data. The floppy disk drive 408 facilitates transporting such data to other computer systems, and hard disk drive 410 permits fast access to large amounts of stored data. The hard disk drive 410 can also include multiple hard disk drives and/or other mass storage devices such as CD-ROMs, CD-Rs, CD-RWs, magnetic tapes, and other optical and non-optical data storage devices.

The microprocessor 416 together with an operating system operate to execute computer code or logic 410A and produce and use data 410B. The computer code or logic 410A and data 410B may reside on the RAM 420, the ROM 422, or the hard disk drive 410. The computer code or logic 410A and data 410B could also reside on a removable program medium and loaded or installed onto the computer system 400 when needed. Removable program media include, for example, CD-ROM, PC-CARD, floppy disk and magnetic tape. The logic 410A can include logic for receiving a product specification. The logic for receiving the product specification can include logic for converting the product specification from a first format to a second format. The logic 410A can also include logic for extracting the parameters from the product specification and logic for storing the parameters in a testing data file. The logic 410A can also include logic for inputting the testing data file into a test bench system and logic for testing the development device. The logic for inputting the testing data file into the test bench system can include logic for transmitting the testing data file to the test bench system via the computer network.

The network interface 412 is used to send and receive data over a network connected to other computer systems (e.g., a test bench). An interface card or similar device and appropriate software implemented by the microprocessor 416 can be used to connect the computer system 400 to an existing network and transfer data according to standard protocols.

The keyboard 414 is used by a user to input commands and other instructions to the computer system 400. Other types of user input devices can also be used in conjunction with the present invention. For example, pointing devices such as a computer mouse, a track ball, a stylus, or a tablet can be used to manipulate a pointer on a screen of a general-purpose computer.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in any of the above figures are not required to be performed in the order illustrated, and that all the processing represented by the operations may not be necessary to practice the invention. Further, the processes described in any of the above can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for testing a development device comprising:
receiving a product specification for the development device, the product specification including an operational description, a plurality of I/O requirements, a plurality of performance parameters, a plurality of physical aspects, wherein the operational description includes a plurality of parameters of the development device including one or more parameters for at least one register in the development device, and the plurality of parameters being arranged in a predetermined first order includes arranging the one or more parameters for the at least one register in a table, the table including a header, the header including a register name, a register offset and a register type and wherein the table includes a row for each of a plurality of bits in the register and wherein each row includes a bitname and descriptive data field for each bit in the register, wherein the descriptive data field includes a bit type and one or more reset values;

extracting the plurality of parameters of the development device from the product specification;

storing the plurality of parameters in a testing data file;

inputting the testing data file into a test bench system being coupled to the development device; and testing the development device.

2. The method of claim 1, wherein receiving the product specification includes converting the product specification from a first format to a second format.

3. The method of claim 2, wherein the second format is a text format.

4. The method of claim 1, wherein the plurality of parameters includes any parameters necessary to test a selected operation of the development device.

5. The method of claim 1, wherein storing the plurality of parameters in a testing data file includes rearranging the plurality of parameters into a second order.

6. The method of claim 1, wherein the development device is simulated.

7. A system for extracting testing data for a development device comprising:
a processor coupled to a computer readable medium having a plurality of computer readable instructions stored thereon including:
logic for receiving a product specification for the development device, the product specification including an operational description, a plurality of I/O requirements, a plurality of performance parameters, a plurality of physical aspects, wherein the operational description includes a plurality of parameters of the development device including one or more parameters for at least one register in the development device, and the plurality of parameters being arranged in a predetermined first order includes arranging the one or more parameters for the at least one register in a table, the table including a header, the header including a register name, a register offset and a register type and wherein the table includes a row for each of a plurality of bits in the register and wherein each row includes a bitname and descriptive data field for each bit in the register, wherein the descriptive data field includes a bit type and one or more reset values;

logic for extracting the plurality of parameters of the development device from the product specification;

logic for storing the plurality of parameters in a testing data file; and logic for inputting the testing data file into a test bench system.

8. The system of claim 7, further comprising a computer network coupled to the processor and wherein the logic for inputting the testing data file into the test bench system includes logic for transmitting the testing data file to the test bench system via the computer network and wherein the test bench system includes logic for testing the development device.

9. The system of claim 7, further comprising the test bench system and wherein the test bench system includes logic for testing the development device.

10. The system of claim 7 wherein the logic for receiving the product specification includes logic for converting the product specification from a first format to a second format.

11. The system of claim 7, wherein the plurality of parameters includes any parameters necessary to test a selected operation of the development device.

12. The system of claim 7, wherein the development device is simulated.

13. A test bench system comprising:
- a processor;
- a storage facility coupled to the processor and containing instructions executable by the processor wherein the instructions include:
    - logic for receiving a product specification for the development device, the product specification including an operational description, a plurality of requirements, a plurality of performance parameters, a plurality of physical aspects, wherein the operational description includes a plurality of parameters of the development device including one or more parameters for at least one register in the development device, and the plurality of parameters being arranged in a predetermined first order includes arranging the one or more parameters for the at least one register in a table, the table including a header, the header including a register name, a register offset and a register type and wherein the table includes a row for each of a plurality of bits in the register and wherein each row includes a bitname and descriptive data field for each bit in the register, wherein the descriptive data field includes a bit type and one or more reset values;
- logic for extracting the plurality of parameters from the product specification;
- logic for storing the plurality of parameters in a testing data file;
- logic for inputting the testing data file into a test bench system; and
- logic for testing the development device.

* * * * *